United States Patent
Hirler et al.

(10) Patent No.: US 8,431,988 B2
(45) Date of Patent: Apr. 30, 2013

(54) LATERAL TRENCH TRANSISTOR, AS WELL AS A METHOD FOR ITS PRODUCTION

(75) Inventors: Franz Hirler, Isen (DE); Uwe Wahl, München (DE); Thorsten Meyer, München (DE); Michael Rüb, Faak am See (AT); Armin Willmeroth, Augsburg (DE); Markus Schmitt, Neukeferloh (DE); Carolin Tolksdorf, Tutzing (DE); Carsten Schäffer, Sattendorf (AT)

(73) Assignee: Infineon Technologies AG, Neubiberg (DE)

(*) Notice: Subject to any disclaimer, the term of this patent is extended or adjusted under 35 U.S.C. 154(b) by 1227 days.

(21) Appl. No.: 11/262,483

(22) Filed: Oct. 28, 2005

(65) Prior Publication Data
US 2006/0118862 A1 Jun. 8, 2006

(30) Foreign Application Priority Data
Oct. 29, 2004 (DE) .......................... 10 2004 052 643

(51) Int. Cl.
*H01L 29/66* (2006.01)
(52) U.S. Cl.
USPC ............. 257/330; 257/E27.091; 257/E29.257
(58) Field of Classification Search .................. 257/288, 257/330, 332, E21.429, E21.652, E29.063, 257/E21.13, E21.345, E29.027, E29.054, 257/E29.133, E29.255; 438/282, 289, 524, 438/589
See application file for complete search history.

(56) References Cited

U.S. PATENT DOCUMENTS

| | | | |
|---|---|---|---|
| 3,975,221 A | 8/1976 | Rodgers | |
| 4,835,585 A * | 5/1989 | Panousis | 257/332 |
| 6,384,456 B1 | 5/2002 | Tihanyi | |
| 6,972,458 B2 | 12/2005 | Suzuki et al. | |
| 2004/0014263 A1 | 1/2004 | Fujishima et al. | |
| 2004/0099922 A1 | 5/2004 | Yamaguchi | |
| 2004/0119091 A1 | 6/2004 | Suzuki et al. | |
| 2005/0230747 A1 | 10/2005 | Suzuki et al. | |

FOREIGN PATENT DOCUMENTS

| | | |
|---|---|---|
| DE | 197 43 342 C2 | 2/2002 |
| DE | 102 10 138 A1 | 10/2003 |
| DE | 103 58 697 A1 | 7/2004 |
| EP | 1 094 525 A2 | 4/2001 |

* cited by examiner

Primary Examiner — Jarrett Stark
(74) Attorney, Agent, or Firm — Maginot, Moore & Beck

(57) ABSTRACT

A lateral trench transistor has a semiconductor body having a source region, a source contact, a body region, a drain region, and a gate trench, in which a gate electrode which is isolated from the semiconductor body is embedded. A heavily doped semiconductor region is provided within the body region or adjacent to it, and is electrically connected to the source contact, and whose dopant type corresponds to that of the body region.

7 Claims, 9 Drawing Sheets

LATERAL TRENCH TRANSISTOR, AS WELL AS A METHOD FOR ITS PRODUCTION

FIELD OF THE INVENTION

The invention relates to a lateral trench transistor and to a method for production of semiconductor regions in a semiconductor body of a lateral trench transistor.

BACKGROUND OF THE INVENTION

Lateral trench transistors are known; in one specific embodiment, they have a semiconductor body in which a source region and a body region, with which contact is made by means of a source contact, a drain region, with which contact is made by a drain contact, and a gate trench, in which a gate electrode which is isolated from the semiconductor body is embedded, are provided. Lateral current flows between the source region and the drain region along a side wall of the gate trench can be produced and controlled by means of the gate electrode.

The holes which are generated when a lateral trench transistor such as this is in the breakdown state, have to pass through the body region, which runs alongside the source region and extends over the entire trench depth, to the source contact and, if the trench depth is sufficient, the generally high layer resistance of the body region results in a high voltage drop across the area of the source region which is furthest away from the source contact. Since the body region of the lateral MOS structure (metal oxide semiconductor) also represents a base region of a parasitic npn transistor (which is formed by the source region, the body region and the drain region), the voltage drop which is generated by the holes can result in the parasitic npn transistor being switched on. This can in turn lead to destruction of the trench transistor.

SUMMARY

A first object on which the invention is based is to specify a lateral trench transistor in which it is possible to inhibit switching on of the parasitic transistor as described above in the breakdown mode.

A second object on which the invention is based is to specify a method for production of a lateral trench transistor, in particular for production of MOS structures within the semiconductor body of a lateral trench transistor.

This object is achieved by a lateral trench transistor and a method for production of doped semiconductor regions in a semiconductor body of a lateral trench transistor in accordance with embodiments of the invention.

One embodiment of a lateral trench transistor according to the invention has a semiconductor body, in which:
  a source region and a body region with which contact is made by a source contact,
  a drain region with which contact is made by a drain contact and
  a gate trench in which a gate electrode which is isolated from the semiconductor body is embedded, are provided. Lateral current flows between the source region and the drain region along one side wall of the gate trench can be controlled by means of the gate electrode. In addition, a heavily doped semiconductor region is provided within the body region or adjacent to it and is electrically connected to the source contact, and whose dopant type corresponds to that of the body region.

The heavily doped semiconductor region allows charge which has been produced during the breakdown mode to flow away to the source contact via a low-impedance path. It is thus possible to reduce the resistance which the charges have to overcome. This likewise reduces the voltage drop produced by the charge carriers, so that it is possible to prevent a parasitic transistor comprising the source region, the body region and the drain region from being switched on.

In one preferred embodiment, the heavily doped semiconductor region extends from the upper face of the semiconductor body, or at a distance from it, into the depth of the semiconductor body. The heavily doped semiconductor region may be directly adjacent to the side wall of the gate trench, or may be at a distance from it.

The penetration depth of the heavily doped semiconductor region into the semiconductor body may be approximately equal to or greater than the penetration depth of the source region into the semiconductor body. The geometric configuration of the heavily doped semiconductor region is in principle undefined. By way of example, the semiconductor region may be in the form of a pillar.

If the source contact is located on the upper face of the semiconductor body, then the heavily doped semiconductor region is expediently made contact with only on the upper face of the semiconductor body. However, if the source contact extends into the semiconductor body, then the heavily doped semiconductor region can expediently be designed in such a way that it is adjacent to the source contact over the entire penetration depth of the heavily doped semiconductor region. This makes it possible to further reduce the resistance which the charge carriers have to overcome before reaching the source contact.

The invention also provides a method for production of a lateral trench transistor, in particular a method for production of doped semiconductor regions in a semiconductor body of a lateral trench transistor. The method has the following steps: a trench is first of all formed in the semiconductor body. Dopants are then introduced into at least one area of the semiconductor body which is adjacent to the trench, by carrying out implantation or driving-in processes, in such a way that corresponding dopants enter the at least one area through the inner walls of the trench during these processes.

If the dopants are introduced into the semiconductor body by means of an implantation process, then, in one preferred embodiment, the implantation beam which is used during the implantation process is aligned or shadowed such that the implantation beam is applied only to defined areas of the inner walls of the trench. The dopants can accordingly be introduced into the semiconductor body using the implantation beam, without masking of the inner walls of the trench. It is, of course likewise possible to cover at least a portion of the inner walls of the trench with a mask, in order to compensate for inaccuracies/tolerances of the implantation beam. The implantation energy, dose and angle can in this case be chosen such that the dose from the back-scattered ions does not interfere with the operation of the component in the shadowed areas.

If the dopants are introduced into the semiconductor body on the basis of a deposition process, then the dopant can either be introduced directly from the gas phase into the semiconductor body, or doped semiconductor layers can be applied to the inner walls of the trench and the dopants contained therein can be driven into the semiconductor body in a subsequent heat-treatment step. For this purpose, it is worthwhile (but not absolutely essential) to first of all apply a mask to the inner walls of the trench.

By way of example, the mask can be produced by applying an oxide layer to the inner walls of the trench, so that the trench is then filled with an auxiliary layer, which can also cover the surface of the semiconductor body. A layer composed of light-sensitive photoresist is deposited onto this. The layer of light-sensitive photoresist is then exposed and developed in order to obtain a structured layer composed of a photoresist. The structured layer composed of photoresist is used in a further process step as an etching mask for anisotropic etching of the auxiliary layer, by which means a structured auxiliary layer is produced on the semiconductor surface and in the trench. The structured auxiliary layer can then in turn be used for etching of the oxide layer, by which means the mask is produced.

Alternatively, the mask can also be produced by depositing an isolation layer onto the inner walls of the trench and a gate electrode layer onto this isolation layer, which gate electrode layer fills the trench. The gate electrode layer can then be structured. In this case, instead of the oxide layer, the structured gate electrode layer is used as an implantation mask or as a mask for a deposition process, with the structured gate electrode layer being used subsequently as the gate electrode.

The semiconductor regions to be produced may, for example, be a source region or a body region. If this is the case, the source and body regions to be produced can be produced in a common step. For this purpose, appropriate areas of the trench inner walls have different dopants applied to them, with different diffusion coefficients, at the same time. For example, boron could be used in order to produce the body region, and arsenic could be used to produce the source region, with both dopants first of all being implanted through the trench inner wall into the semiconductor body, and then being driven out.

Alternatively, it is possible to produce the source and body regions to be produced in a plurality of steps by applying different dopants to appropriate areas of the trench inner walls at different times. The inner wall areas of the trench to which dopants are applied in order to produce the source and body regions are a portion of a side wall of the trench, in one preferred embodiment. Alternatively, these areas can also be provided by a portion of an end face inner wall or the entire end face inner wall of the trench.

In one preferred embodiment, the areas to which dopants are applied in order to produce the source and the body region are identical, that is to say different dopants are introduced into the semiconductor body through the same area. In order to produce different extents of the source and body regions in the semiconductor body, and thus to set appropriate channel lengths, it is either possible to use different diffusion constants, different diffusion temperatures, or driving-out processes of different length, etc.

In addition to source and body regions, drain regions, drift regions or other semiconductor regions can also be produced simultaneously or at different times in the manner described above. The semiconductor body is preferably in the form of an $n^{-1}$-doped drift region in the area of the trench. The drift region therefore generally need not be formed as an extra item. If, in contrast, the basic dope of the semiconductor body is such that the semiconductor body is not suitable for use as a drift region, then a drift region can be produced in the area of the trench, in the manner described above. It is thus possible, for example, to introduce a source region into the semiconductor body at one end of the trench (end face), and a drain region of the same dopant type into the semiconductor body at the other end of the trench (end face). Before these regions are formed, a body region and, if required, a drift region can be produced in the semiconductor body by application to appropriate inner wall areas (the regions may also be introduced into the trench base or the semiconductor surface), connecting the subsequently produced source and drain regions, or the subsequently produced source regions and the drift region, to one another.

It is also possible to produce a heavily doped semiconductor region (body contact region) within the body region, which is electrically connected to the source contact. The area of the trench inner walls which is used for production of the heavily doped semiconductor region is chosen such that the heavily doped semiconductor region is adjacent to a source contact, which is used to make contact with the source and body regions.

The dopants can be driven out by one or more heat-treatment processes after introduction into the semiconductor body. This means, for example, that it is possible to define the different extent of the source region and body region with respect to one another, and thus to set the channel length of the body region to a desired value.

In a first preferred embodiment, the trench which is used for introduction of the dopants is a gate trench, that is to say a gate electrode is embedded in the trench in a subsequent process step. As an alternative to this, it is possible not to use this trench as a gate trench, that is to say to use the trench only for introduction of the dopants into the semiconductor body, but to separate this trench from a gate trench in such a way that the introduction of the dopants which are used to form the source, body and drain regions into the semiconductor body, and the subsequent driving out of these dopants, results in the production of MOS structures on at least a portion of the outer walls of the gate trench. The dopants are thus shifted through the semiconductor body starting from an "extraneous" trench in the direction of the "actual" gate trench.

As has already been indicated, it is possible in this case as well to choose the diffusion constants and/or the driving-out processes for the dopants that have been introduced appropriately to set the channel length of the body region that is produced, to a desired value.

The method according to the invention has been described in the description above on the basis of a single trench. It is also possible to introduce a plurality of trenches into the semiconductor body, instead of one trench, and to apply dopants to their respective inner walls at the same time.

If these trenches are subsequently used as gate trenches, then it is advantageous to align them with respect to one another, to choose the respective masks and to define appropriate areas of the trench inner walls such that each heavily doped semiconductor region which is introduced into the semiconductor body from one of the trenches touches or passes through a body region which has been introduced into the semiconductor body from another trench, with the dopant type of the highly conductive semiconductor region corresponding to that of the body region.

The introduction of the body regions into first side walls of the trenches, and the introduction of the body contact regions into the second side walls (opposite the first side walls) of the trenches can be carried out on the basis of directional implantation processes.

BRIEF DESCRIPTION OF THE DRAWINGS

The invention will be explained in more detail in the following text in the form of an exemplary embodiment and with reference to the figures, in which.

DETAILED DESCRIPTION

Areas, components and component groups which are identical or correspond to one another are identified by the same reference numbers in the figures. Furthermore, all of the embodiments can be inversely doped, that is to say p-regions and n-regions can be interchanged with one another.

Figure 1:
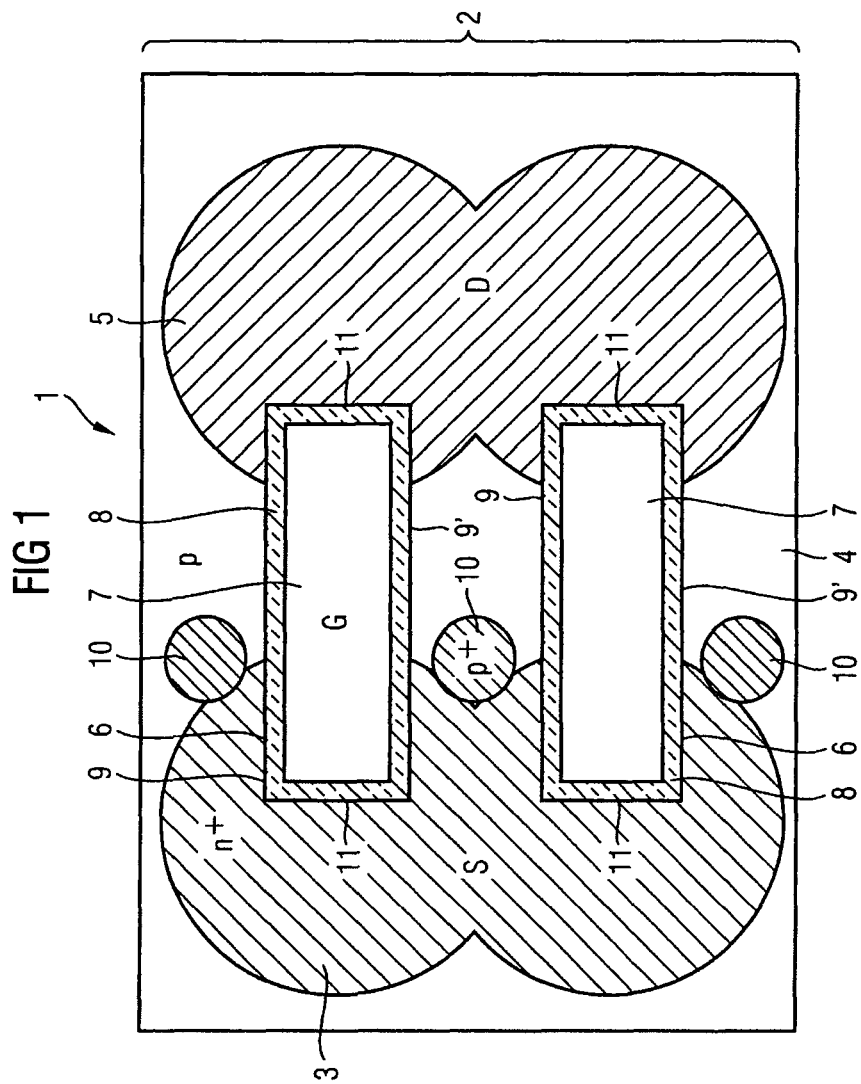
FIG. 1 shows a plan view of a first embodiment of a lateral trench transistor according to the invention.

FIG. 1 shows a first embodiment of the lateral trench transistor according to the invention. A lateral trench transistor 1 has a semiconductor body 2 in which an $n^{30}$-doped source region 3 and a p-doped body region 4, with which contact is made by means of a source contact (which is not shown here), an $n^{30}$-doped drain region 5 and a gate trench 6, in which a gate electrode 7 is embedded, are provided. The gate electrode 7 is electrically isolated from the semiconductor body 2 by an isolation layer 8.

In this embodiment, a plurality of gate trenches 6 are provided and are arranged parallel to one another, with in each case one end of a gate trench 6 ending in the source region 3, and one end of the gate trench 6 ending in the drain region 5. The gate electrodes 7 allow current flows along the gate trench side walls 9 between the source region 3 and the drain region 5 to be controlled/produced.

Furthermore, $p^{30}$-doped semiconductor regions 10 are formed within the body region 4 and penetrate into the depth of the semiconductor body 3 from the surface of the semiconductor body 2 ("parallel" to the source region 3 and the drain region 5). The semiconductor regions 10 are electrically connected to the source contact, and result in holes which are produced within the body region 4 being able to flow away to the source contact via the semiconductor regions 10, with a low impedance. This makes it possible to reduce the voltage drop which is caused by the migration of the holes within the body region 4. This also reduces the risk of a parasitic npn transistor, which is formed from the source region 3, the body region 4 and the drain region 5, being switched on.

Figure 2:
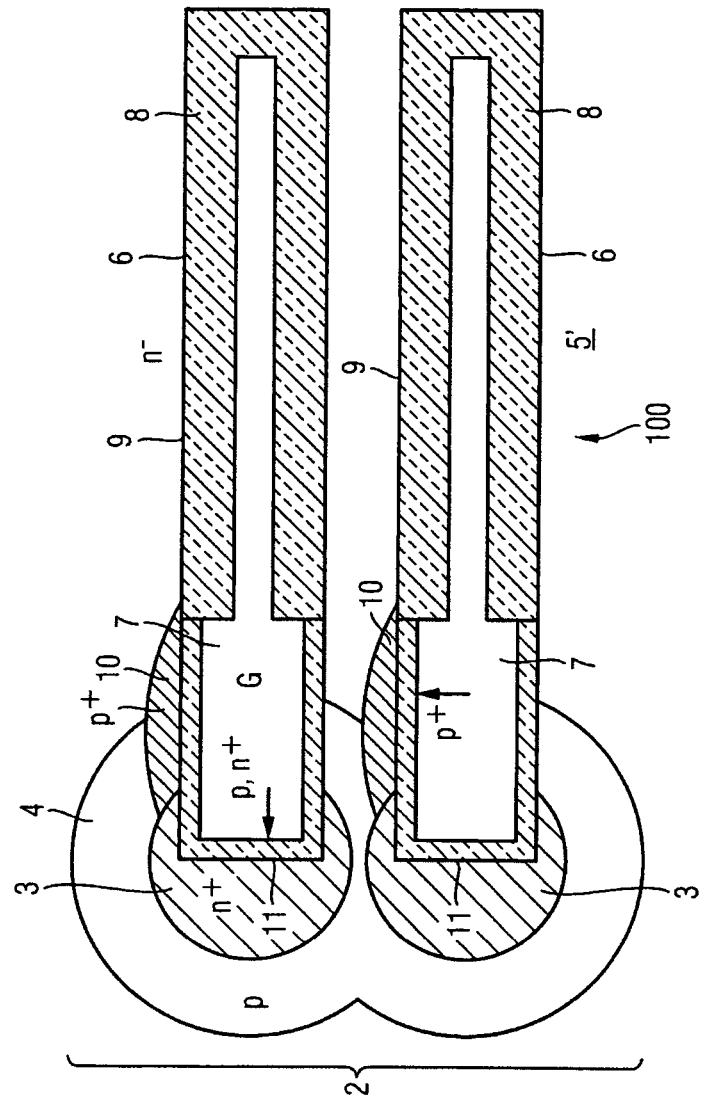
FIG. 2 shows a plan view of a second embodiment of a lateral trench transistor according to the invention.

FIG. 2 shows a further embodiment of a lateral trench transistor 100 according to the invention. The lateral trench transistor 100 has a plurality of gate trenches 6, whose inner walls are lined with isolation layers 8. The isolation layers 8 are thinned at one end. The isolation layers 8 electrically isolate the gate electrodes 7 from the semiconductor body 2. Furthermore, a body region 4 is provided, and source regions 3 are embedded in it. The source regions 3 surround end faces 11 of the gate trenches 6. Furthermore, $p^{30}$-doped semiconductor regions 10 are provided, which are each adjacent to a gate trench side wall 9 and are connected to a source region 3 and to the body region 4. The gate electrodes 7 allow current flows along the gate trench side walls 9 between the source region 3 and the drift region 5' (the drain region is not shown in FIG. 2) to be controlled/produced. The gate trenches 6 extend from the source regions 3 in the direction of the drain regions, which are not shown here, into the drift region 5'. The isolation layers 8 are thickened in the right-hand part of the gate trenches 6, and are used to decrease the electrical field when the trench transistor 100 is switched off. The use of thickened isolation layer areas on the one hand and the use of field electrodes (right-hand, thinned part of the gate electrodes 7 within the trench 6) on the other hand make it possible to ensure that the drift region 5' can on the one hand be relatively heavily doped while, on the other hand, it can be depleted when the transistor 100 is switched off.

Figure 3:
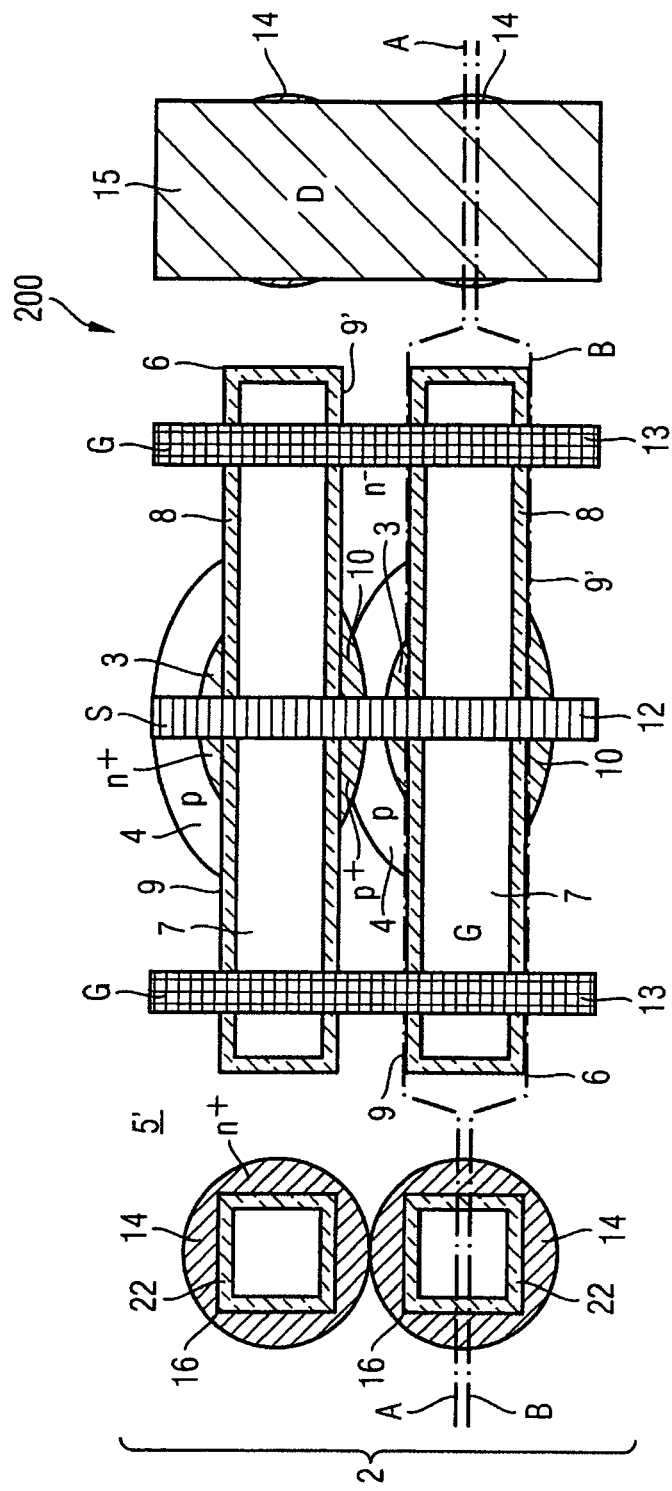
FIG. 3 shows a plan view of a third embodiment of a lateral trench transistor according to the invention.

FIG. 3 shows a third embodiment of the lateral trench transistor according to the invention. A lateral trench transistor 200 has a plurality of gate trenches 6, in each of which one gate electrode 7 is embedded. The gate electrodes 7 are electrically isolated from the semiconductor body 2 via appropriate isolation layers 8. Furthermore, source regions 3 are provided, with each source region being adjacent to one gate trench side wall 9. Each source region 3 is embedded in one body region 4, with each body region being adjacent to the same gate trench side wall 9 to which the corresponding source region 3 is also adjacent. Heavily doped semiconductor regions 10 whose dopant type corresponds to the dopant type of the body regions 4 are in each case adjacent to a gate trench side wall 9', which is opposite the gate trench side wall 9 to which the body regions and source regions are adjacent. Each body region 4 overlaps a heavily doped semiconductor region 10. This ensures that holes which are produced in the body region 4 during breakdown can effectively be carried away via one of the heavily doped semiconductor regions 10 to a source line 12, which is electrically connected to the heavily doped semiconductor regions 10. This makes it possible to prevent the hole current from causing a voltage drop which activates parasitic npn transistors comprising a source region 3, a body region 4 and the drift region 5'.

The source contact 12 makes contact not only with the heavily doped semiconductor regions 10 but also with the source regions 3 and the body regions 4. The gate electrodes 7 are electrically connected to the gate lines 13. Furthermore, drain connection regions 14 are provided within the drift region 5', and are electrically connected to drain lines 15. The drain connection regions 14 are in this case adjacent to trenches 16. The trenches 16 may, for example, be filled with polysilicon or with a dielectric material. The trenches 16 are preferably at least partially filled with polysilicon 22.

The source lines 12, the gate lines 13 and the drain lines 15 are electrically isolated from the semiconductor body 2 by means of an isolation layer which is not shown here, and are electrically connected via contact holes to the source regions 3/the body regions 4/the heavily doped semiconductor regions 10, the gate electrodes 7 and the drain connection regions 14.

Figure 4:
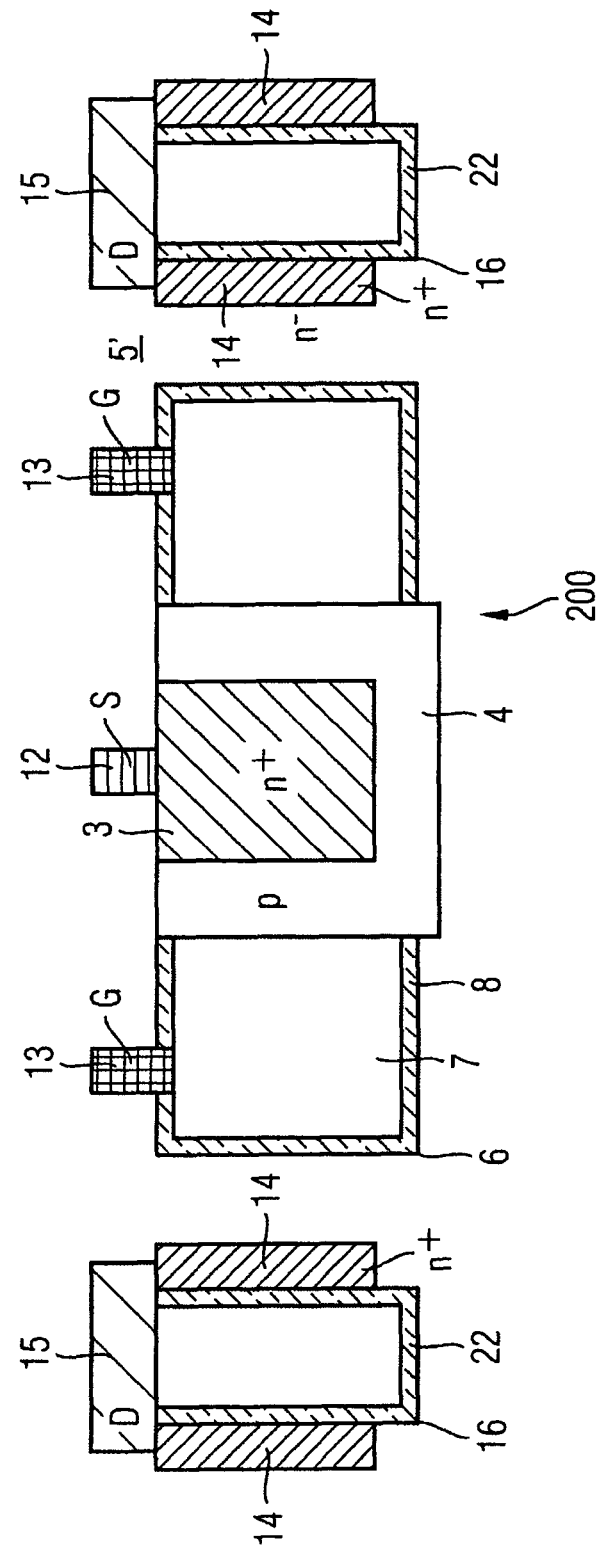
FIG. 4 shows a cross-sectional illustration of the embodiment shown in FIG. 3, along the line A.
Figure 5:
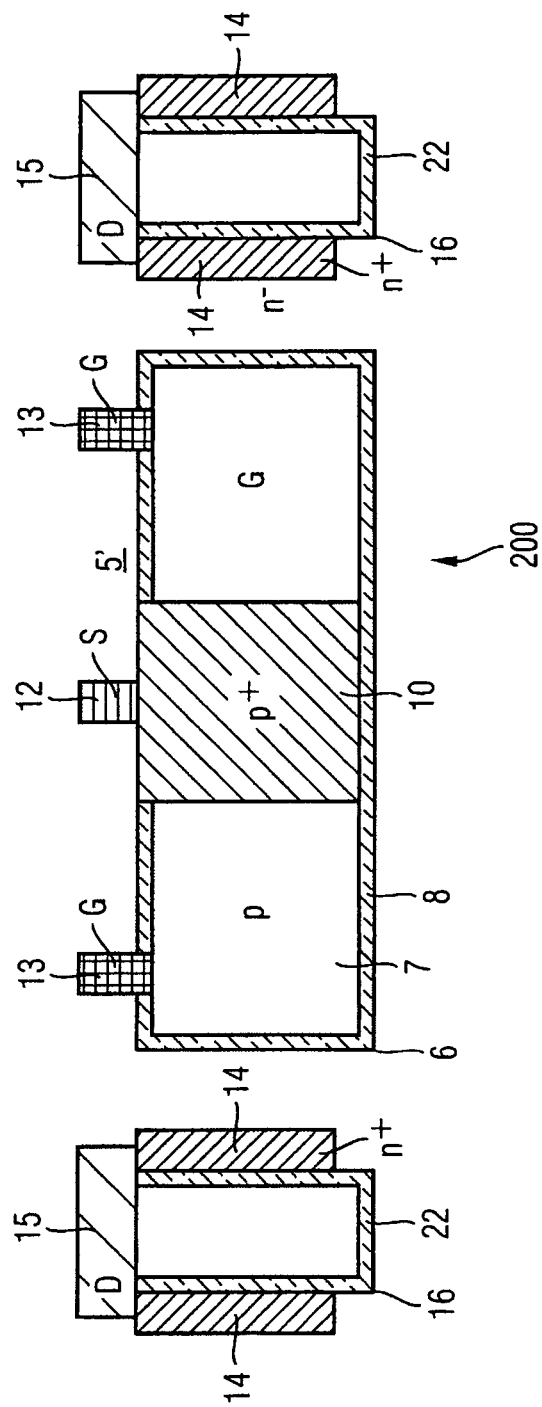
FIG. 5 shows a cross-sectional illustration of the embodiment shown in FIG. 3, along the line B.

FIG. 4 shows the lateral trench transistor 200, as shown in FIG. 3, along the line A in the form of a cross-sectional illustration. FIG. 5 shows the lateral trench transistor 200, as shown in FIG. 3, in a cross-sectional illustration along the line B. The isolation layer 8 is partially omitted from the cross-sectional illustrations shown in FIGS. 4 and 5.

Figure 6:
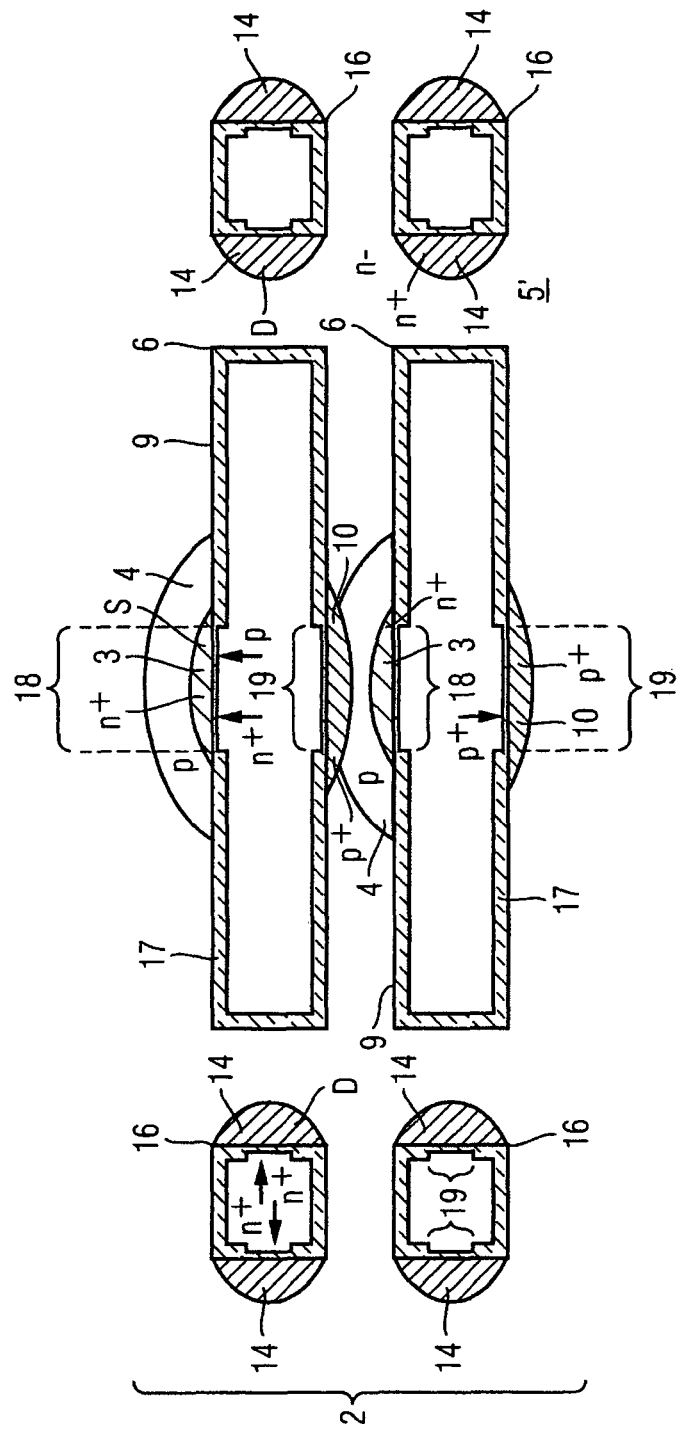
FIG. 6 shows an outline sketch in order to indicate a first embodiment of the production method according to the invention.

FIG. 6 shows one possible production method for the lateral trench transistor 200 shown in FIGS. 3 to 5. First of all, the gate trenches 6 are formed in the semiconductor body 2. The inner walls of the gate trenches 6 are then covered with masks 17 (the mask 17 can also subsequently be used as an isolation layer). The masks 17 are designed such that dopants can enter the semiconductor body 2 through the gate trench side walls 9, 9' via areas 18. The isolation layer 8 need not necessarily be removed in the areas in which the dopants enter the semiconductor body 2 (the area 18). As can be seen from FIG. 6, isolation layer residues may remain in this area during the implantation process. A contact is subsequently produced from the inside of the trench to the $n^{30}$-region.

The isolation layer can even remain when the contacts are formed only on the surface. For a deposition process, it is expedient to completely remove the isolation layer 8 in the areas 18.

By way of example, in order to form the source regions 3 and the body regions 4, dopant can initially be applied, in order to form the body regions 4, to the areas of the gate trench side walls 9 which are located behind the areas 18. Once the dopants have been driven out in a heat-treatment process, dopants can be introduced into the semiconductor body 2, in order to form the source regions 3, via the same area. If suitable (different) diffusion coefficients are chosen for the dopants, then the dopants for the source regions 3 and the body regions 4 can also be introduced through the areas 18 into the semiconductor body 2 at the same time. Once the dopants have been introduced, heat-treatment processes can be carried out in order to drive out the dopants that have been introduced. The driving-out processes allow fine adjustment of the MOS channel lengths along the gate trench side walls 9. Heavily doped semiconductor regions 10 can be formed before or after the formation of the source regions 3 and the body regions 4 by introducing appropriate dopants into the semiconductor body 2 via areas 19.

The dopants can be introduced into the semiconductor body 2 by driving-in processes or implantation processes. For example, it is possible to cover the mask 17 with doped semiconductor layers and then to carry out a heat-treatment process, as a result of which the dopants in the doped semiconductor layers enter the semiconductor body 2. Alternatively, the dopants can also be driven directly from the gas phase into the semiconductor body 2. If an implantation method is used, then the dopants are generally activated and/or driven out subsequently.

The drain connection regions 14 are formed analogously by application of appropriate dopants to areas 23 of the inner walls of the trenches 16.

Figure 7:
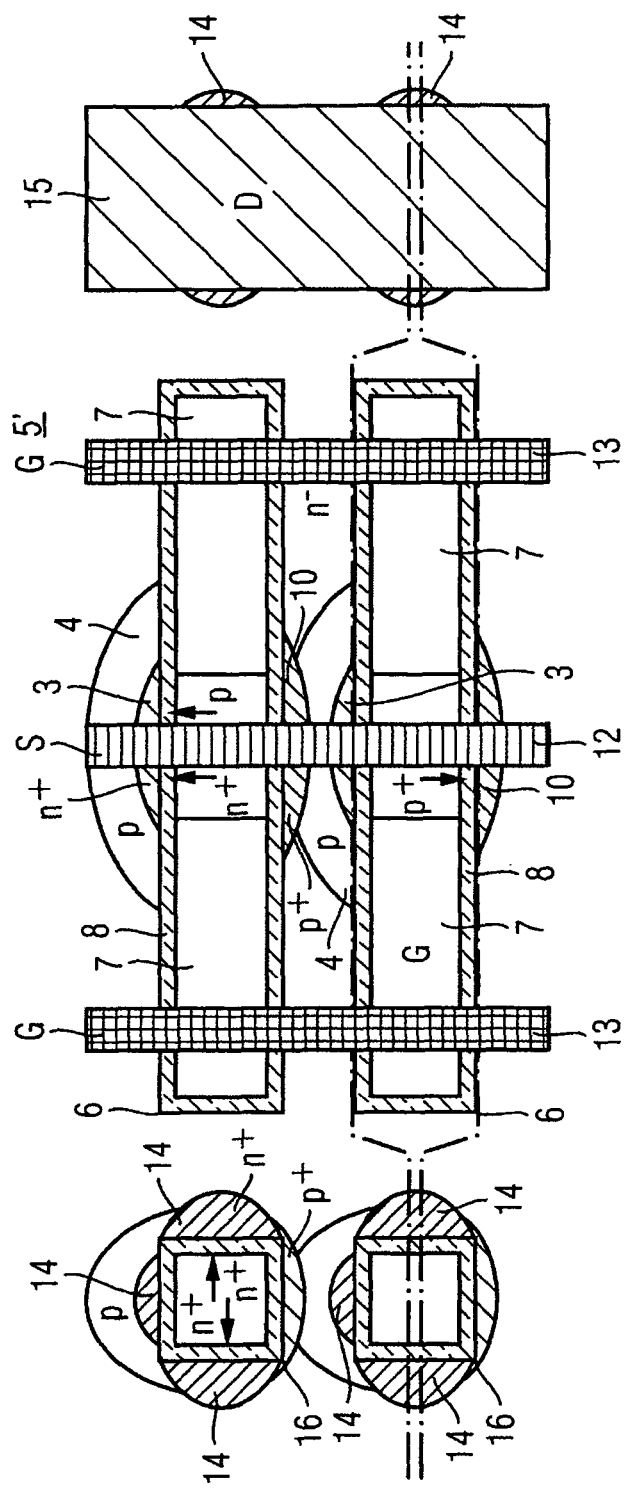
FIG. 7 shows an outline sketch in order to indicate a second embodiment of the production method according to the invention.

After formation of the source regions 3, body regions 4, $p^{30}$-doped semiconductor regions 10 and the $n^{30}$-doped drain connection regions 14, the masks 17 can be removed again, and gate electrodes 7 can be introduced into the gate trenches 6. An appropriate isolation layer 8 should also have previously been applied to the inner walls of the gate trenches 6. As an alternative to this, it is possible, as is indicated in FIG. 7, to provide isolation layers 8 instead of the masks 17 within the gate trenches 6, and then to introduce the gate electrodes 7, and to structure the gate electrodes 7, so that the structured gate electrodes (together with the structured isolation layers 8) are used as a mask for the introduction of the dopants into the semiconductor body 2. The $p/p^{30}$-regions which are adjacent to the trenches 16 do not carry out any particular purpose, but result from the process involved in the method according to the invention. Additional effort will be required to avoid the formation of these regions, but it is not necessary to avoid these regions.

Figure 8:
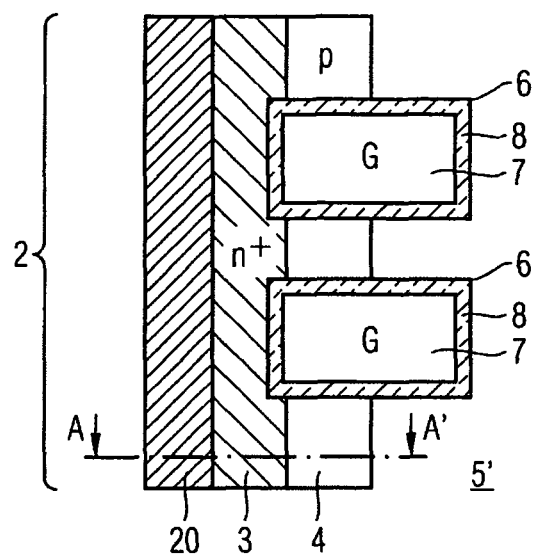
FIG. 8 shows an outline sketch in order to indicate a third embodiment of the production method according to the invention.

FIG. 8 shows a method for production of source and body regions 3, 4 in a semiconductor body 2, in which the dopants are not introduced into the semiconductor body 2 via gate trenches 6 but via a separate trench 20. The parameters for introduction of the dopants into the semiconductor body 2 are in this case chosen such that the dopants migrate toward the gate trenches 6 and form MOS structures on their gate trench side walls 9, 9'. Channels can be produced (within the body regions 4) in the MOS structures by means of the gate electrodes 7. A plurality of separate trenches 21, which are isolated from one another, can also be used instead of the separate trench 20, in which case the inner walls of the trenches 21 advantageously have appropriate dopants applied to them at the same time, so that the source and body regions 2, 4 are formed uniformly. It is likewise possible to produce the source regions 3 after the body regions 4 have been formed or driven out. In this case as well, as has been described in conjunction with FIGS. 1 to 7, the $p^{30}$-doped connection regions can be introduced into the semiconductor body 2 in order to make contact with the body regions 4. The inner walls of the separate trench 20, or the inner walls of the separate trenches 21, can be appropriately masked for this purpose (analogously to the masking method for the trench inner walls, as described above).

Figure 10:
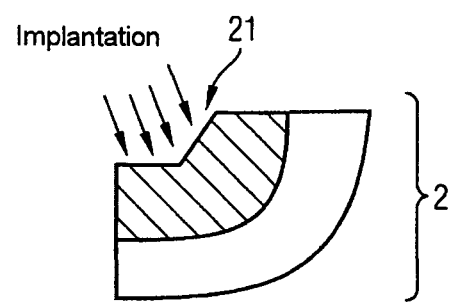
FIG. 10 shows an outline sketch of a process step in the production method indicated in FIGS. 6 to 9.

FIG. 10 shows one possible production method for the trenches 20, 21. In this production method, the trenches 20, 21 are produced by an etching agent which etches selectively with respect to specific crystal axes. This makes it possible to produce side walls with defined trench side angles, which are covered reproducibly with dopants with the aid of relatively steep implantation angles (steep implantation beams).

Figure 11:
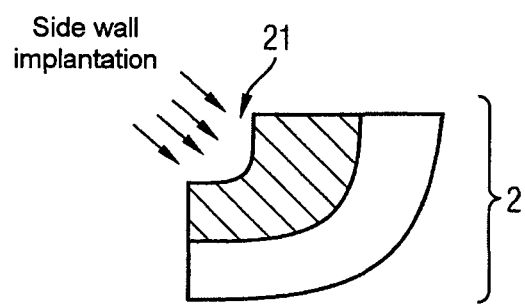
FIG. 11 shows an outline sketch of a further process step in the production method indicated in FIGS. 6 to 9.

FIG. 11 shows a trench 20, 21 which was produced by means of a severely anisotropic etching method. The dopant coverage of the side wall is highly dependent on the aspect ratio of the trench 20, 21 in the case of an implantation process.

Further aspects of the invention will be described in the following description.

The invention describes a production method for formation of an MOS channel for lateral transistors with a lateral current flow on one trench side wall. The method allows the simultaneous production of a low-impedance drain region.

In this context, reference should be made to the document DE 19743342 C2, which describes a transistor with a lateral current flow along a channel on one side wall, with source, gate and drain regions being provided in the walls of different trenches. One disadvantage of this method is that the channel length and the threshold voltage of the transistor depend on distance fluctuations in the trenches, and thus fluctuate over the depth if the trench walls are not perfectly perpendicular. A well controlled channel length, which is as short as possible, in conjunction with a threshold voltage that is uniform everywhere are, however, actually essential for low-voltage power transistors for which $V_{br}$<100 V for a low specific switch-on resistance $R_{on}$·A (R=switch-on resistance, A=the active chip area). Similar structures are described in the document "Sakakibara, Break-through of the Si Limit under 300V breakdown voltage with new concept power device: Super 3D MOSFET ISPSD 2002 und Yamaguchi, Ultra Low On-resistance Super 3D MOSFET, ISPSD 2003". Furthermore, a similar method is described in the document DE 19818300 C1 in which compensation structures pass through the drift path.

According to a first aspect of the invention, the source region and the body region are introduced into the side wall of one and the same trench, and the channel length and threshold voltage Vth are set by relatively strongly driving out of the body region. The source region is in this case not driven out or is driven out to a lesser extent than the body region. The source region and the body region are preferably not introduced into the entire trench wall, but parts of the trench wall are masked. This can be done by application of masking layers (for example oxide), which prevent implantation or driving in (from the gas phase, covering layers or epitaxial layers, the introduction can be carried out separately in two stages for p-dopants and n-dopants, or in one stage with diffusion constants of different intensity for p-dopants and n-dopants, for example boron and arsenic). The masking regions are in this case largely identical for the body and source regions. The masking can also be carried out by shadowing of the implantation beam, for example by carrying out implantation into only one side wall of a rectangular trench.

The following method can be used to produce masking on the trench side wall: the trench walls are coated with oxide which is sufficiently thick to act as a barrier for the implantation or driving-in process from a deposited layer. The trench is then filled with an auxiliary layer and may also be applied to the surface of the semiconductor body, followed, finally, by a light-sensitive photoresist. The photoresist is exposed and structured. The photoresist is used as a masking layer during essentially anisotropic etching of the auxiliary layer. In this case, the etching of the auxiliary layer may extend to the base of the trenches or else end before them, in order to prevent the formation of a channel at the trench base. The auxiliary layer is used as masking for isotropic etching of the oxide layer. A thin stray oxide can be grown after removal of the photoresist and auxiliary layer. This is followed by implantation of, for example, boron and a driving-out process, which can be used to set the penetration depth of the body regions. Arsenic or phosphorus is then implanted in the side wall, and is healed or is driven out slightly. The channel length is set in a self-adjusting manner to the same mask edge by means of the different penetration depths of the body region and source region. The implantation is carried out at an angle of, for example, 30° to the normal to the surface. If implantation is intended to be carried out in a plurality of side walls, then the semiconductor body is rotated suitably between the individual implantation processes. The masking oxide and the stray oxide can then be removed, and the gate oxide can be grown in the trench, and if required on the semiconductor surface, and the gate electrodes can be applied. This is followed by further known processes (isolation, contact formation, metallization . . . ).

So far, all that has been described is the capability to form channels on the side walls of the gate trenches in the body region. Additional channel regions can be produced in an analogous manner on the trench base and on the surface of the semiconductor body.

It is possible to use the gate poly itself as a mask: after the formation of the trenches, gate oxide is grown on the inner walls of the trench, and a gate poly layer is deposited. This is structured by means of a photographic technique and an anisotropic etching method in the trenches and, if required, on the surface. The gate poly is used as a mask for the introduction of source and body regions.

A body contact area can also be produced in the semiconductor body and assists the process of holes flying away to contacts when an avalanche breakdown occurs. For this purpose, a second area can be defined in a further masking step for introduction of the body contact areas on the trench side wall on which body regions and source regions are also produced. Alternatively, the one opening in the masking layer is produced on two different trench side walls. Source and body doping is then implanted into the opening on the first side wall, and the body contact doping is implanted into the opening on the second side wall, by rotation of the semiconductor body. Introduction by a further trench is also possible. The expression "side wall" of a trench means, for example, the upper or lower area of the trench 17 in FIG. 6, within which the areas 18 and 19 are formed.

According to the invention, the drain region can be produced together with the source region. For this purpose, masking can be produced in the same trench or in another trench, and is open at another (second) point than the first point, which is provided for the combined source and body implantation. The source implantation is then carried out through the first and second points on the inner wall, with the source and drain regions being formed in the process, while the body implantation is carried out only through the first point on the inner wall.

Alternatively, the body implantation can be masked in the drain trench, for example by means of a photoresist layer.

Alternatively, the drain region can also be formed without trenches.

Compensation regions or field plates incorporated in trenches can pass through the drift region (drain region) in order to clear the drift path. In particular, a plurality of field plates can be provided in the source/drain direction and are connected to floating p-regions, thus being at different potentials when switched off.

The source and drain regions as well as body regions may result in a considerable resistance to the distribution of the current from the metallization on the surface into the depth. Highly conductive (heavily doped polysilicon) or metallic layers (silicide, tungsten, titanium, . . . ), which make contact with the source, body and drain regions over their entire penetration depth into the semiconductor body, should thus advantageously be provided.

The concept according to the invention can also be applied to an IGBT (Insulated Gate Bipolar Transistor). In this case, a p-region is used instead of the $n^{30}$-doped drain contact region.

According to a second aspect of the invention, the source and body regions of the power transistor are introduced into the semiconductor body from the inner wall of at least one trench which is provided in addition to one or more gate trench or trenches. A double diffusion process is preferably used in this case. The processes described above are generally also double diffusion processes, to the extent that the body and source are driven out to widely differing extents by different diffusion processes. The double diffusion process makes it possible for the process of driving out of the source region to be less intensive than the driving out of the body region, which is driven out to a greater extent because the temperature budget is higher. Channel lengths and threshold voltages Vth can thus be set precisely and in a self-adjusting form. The source and body doping may, for example, be introduced by implantation into an inner wall of the additional trench. However, process steps such as driving in from the gas phase, deposited layers or epitaxial layers are also feasible, and the introduction processes can be carried out separately in two steps for p-dopant and n-dopants, or can be carried out in one step, by choosing p- and n-dopants with widely differing diffusion constants, for example boron and arsenic. The additional trench for driving out the source and body regions may in this case be arranged at right angles to the gate trenches, or may be formed from a plurality of individual trenches which are arranged offset between the gate trenches. The additional trenches can be produced together with the gate trenches or at different times. In the first case, a process step is required to make it possible to prevent the additional trenches being filled with gate electrode material, or to be dissolved selectively out of the additional trenches by means of the gate electrode material.

Figure 9:
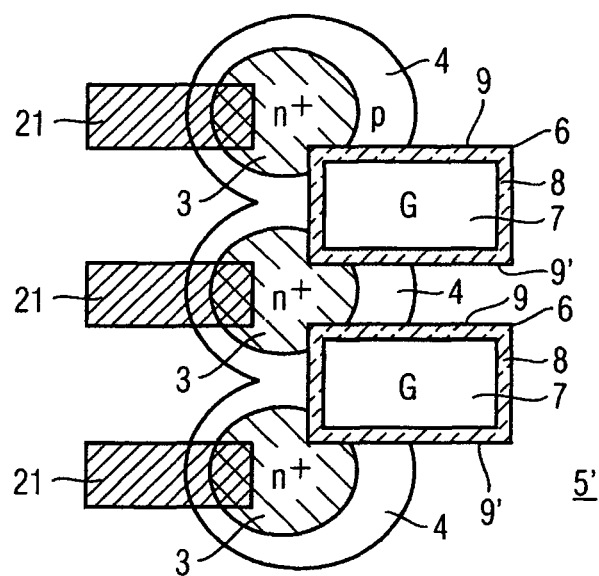
FIG. 9 shows an outline sketch in order to indicate a fourth embodiment of the production method according to the invention.

FIGS. 8 and 9 show plan views of second exemplary embodiments. In the exemplary embodiment shown in FIG. 8, the additional trench from whose side wall the source ($n^{30}$-region) and body region (p-region) are driven out is illustrated as a cohesive structure (a continuous trench), whose longitudinal direction runs at right angles to the longitudinal alignments of the gate trenches. In the embodiment illustrated in FIG. 9, this trench is "broken up" into a plurality of individual trenches, which are arranged offset between the gate trenches.

FIGS. 10 and 11 show different production methods for the additional trenches illustrated in FIGS. 8 and 9. In FIG. 10, the trench is produced by an etching agent (for example KOH), which etches selectively with respect to specific crystal axes. This allows defined trench side angles to be achieved, which can be covered reproducibly with dopant with the aid of relatively steep implantation angles.

If the trench is produced by a highly anisotropic etching method (for example a plasma etching process, see FIG. 11), the dopant covering on the side wall resulting from the implantation is highly dependent on the aspect ratio of the trench. Furthermore, a uniform distribution of the "open area" (trench opening area) is necessary for an optimum etching result from the plasma etching process. This is particularly true when gate trenches and additional trenches are produced at the same time.

The embodiment illustrated in FIG. 9 applies in particular to both claims. The aspect ratio can be optimized for implantation onto the trench side walls facing the gate trenches, over the longitudinal extent of the trenches, by splitting into elongated individual trenches, whose longitudinal axis orientation corresponds to that of the gate trenches. Furthermore, this makes it possible to prevent enlargement of the "open area" in the area of the driving-out trenches (otherwise these would be long and broad). In the case of an anisotropic plasma etching process, the trench depth depends on the "open area" on the wafer. It is thus advantageous to make the "open area" of the auxiliary trench to be of a similar size to that of the gate trench, and this is achieved in this case by splitting into different auxiliary trenches (separate trenches 21).

A third aspect of the invention proposes that a heavily doped $p^{30}$-region, which runs parallel to the source and body regions into the depth, and is also referred to as a body contact region be used to reduce the voltage drop that is produced by the current flow of holes in the body region to such an extent that parasitic npn transistors are not activated, thus preventing premature destruction of the component when subjected to an avalanche breakdown load. (In the case of silicon, this makes it possible to prevent destruction of the component below a junction temperature of 200° C. ... 400° C.). This is advantageous both in the case of metallic contacts over the entire trench depth and in the case of contacts on the surface. The body contact region can accordingly make contact with the source metallization over the entire penetration depth or only on the surface. The depth of the body contact region should correspond approximately to the depth of the source region, or should be deeper.

In principle, it may also be advantageous not to connect the body region, thus resulting in a backward-blocking transistor.

In addition, it may be advantageous to form the source and drain contacts on the lower face of the semiconductor body.

The invention claimed is:

1. A lateral trench transistor having a semiconductor body, the lateral trench transistor comprising:
   a source region and a body region electrically connected to a source contact,
   a drain region electrically connected to a drain contact,
   a gate trench containing a gate electrode which is isolated from the semiconductor body, the gate electrode configured to control lateral current flows between the source region and the drain region along at least a first side wall of the gate trench, and
   a doped semiconductor region within or adjacent to the body region, the doped semiconductor region penetrating into a depth of the semiconductor body from a surface of the semiconductor body, the doped semiconductor region adjoining the source contact such that the doped semiconductor region is electrically connected to the source contact, and the doped semiconductor region having a dopant type that corresponds to a doping type of the body region, the doped semiconductor region being more heavily doped than the body region.

2. The trench transistor as claimed in claim 1, wherein the doped semiconductor region extends downward from an upper face of the semiconductor body.

3. The trench transistor as claimed in claim 1, wherein the doped semiconductor region is adjacent to the first side wall of the gate trench.

4. The trench transistor as claimed in claim 1, wherein a penetration depth of the doped semiconductor region into the semiconductor body is equal to or greater than a penetration depth of the source region into the semiconductor body.

5. The trench transistor as claimed claim 1, wherein the source contact has a penetration depth, and is configured such that the doped semiconductor region is adjacent to the source contact over all of the penetration depth.

6. The trench transistor as claimed in claim 1, wherein the source contact is configured to make contact with the doped semiconductor region only in an area of the doped semiconductor region proximate the surface of the semiconductor body.

7. The lateral trench transistor of claim 1 wherein the doped semiconductor region is provided in addition to the source region, the body region, and the drain region, wherein the doped semiconductor region is positioned within or adjacent to the body region, and wherein the doped semiconductor region is in direct contact with the source contact.

* * * * *